United States Patent [19]

Suzuki

[11] Patent Number: 5,686,984
[45] Date of Patent: Nov. 11, 1997

[54] PROJECTION EXPOSURE METHOD AND APPARATUS TO DETERMINE OPTICAL PERFORMANCE OF RETICLE

[75] Inventor: Akiyoshi Suzuki, Tokyo, Japan

[73] Assignee: Canon Kabushiki Kaisha, Tokyo, Japan

[21] Appl. No.: 711,790

[22] Filed: Sep. 10, 1996

[30] Foreign Application Priority Data

Sep. 12, 1995 [JP] Japan .................................. 7-259405

[51] Int. Cl.⁶ .................................................. G03B 27/42
[52] U.S. Cl. ........................................................ 355/53
[58] Field of Search .............................. 355/53, 68, 70;
430/5

[56] References Cited

U.S. PATENT DOCUMENTS 5,436,692  7/1995  Noguchi .............................. 355/53
5,481,332  1/1996  Shiraishi ............................. 355/53

*Primary Examiner*—Howard B. Blankenship
*Attorney, Agent, or Firm*—Fitzpatrick, Cella, Harper & Scinto

[57] ABSTRACT

A projection exposure method wherein a semi-transparent material effective to partially transmit exposure light and also effective to change a phase of the exposure light is used to form a circuit pattern and a light blocking zone adjacent to the circuit pattern, on a transparent substrate to provide a reticle, the light blocking zone being constituted by a pattern not resolved by a projection optical system, and wherein the reticle is illuminated with the exposure light and is projected on a member to be exposed, through the projection optical system is disclosed. The method includes detecting light quantity of an image of the light blocking zone as formed through the projection optical system, comparing the result of the detection with a predetermined value, and discriminating appropriateness of performing an exposure process with the reticle, on the basis of the comparison.

7 Claims, 5 Drawing Sheets

PROJECTION EXPOSURE METHOD AND APPARATUS TO DETERMINE OPTICAL PERFORMANCE OF RETICLE

FIELD OF THE INVENTION AND RELATED ART

This invention relates to an exposure method wherein a pattern formed on a first object such as a reticle is irradiated with ultraviolet light or deep ultraviolet light so that it is transferred through a projection optical system onto a second object such as a wafer, being coated with a photosensitive material. In another aspect, the invention is concerned with an exposure apparatus using the exposure method as above.

In accordance with advancement of optical lithography, there arises a problem of limit of fine processing based on light. Unique imaging techniques such as a phase shift method or modified illumination method have been developed to extend the limit. Favorable results are attainable with them and, actually, some of them are practically used.

Most attractive one of them may be an imaging method using a half tone reticle, which method is a kind of phase shift technique. The phase shift technique encounters problems in relation to film formation or CAD of a circuit pattern, when it is to be practically applied. This is particularly notable in the type called "Levenson type". As for a half tone reticle, on the other hand, although it does not provides an effect as high as of Levenson type, the production of the same is easier and advantageous results may be accomplished with a restriction to patterns to be used with method.

A half tone reticle does not have binary transmission mode, i.e., transmission and non-transmission, as of conventional reticles. Rather, a few percentages of light passes through a region which has conventionally been called "non-transmissive". This is why it is called "half tone". Another distinction of the half tone reticle over the conventional type reticle resides in that the phase of light passing such few-percentage-transmission region is changed, by 180 deg., from that of light passed through an ordinary light transmissive region. Because of this, the reticle uses both of amplitude and phase. Thus, it contributes much to enhancement of imaging performance. The half tone reticle is known as one that provides a large advantageous effect to improvement of imaging performance of a very small angle pattern (contact hole pattern) which is one of the most difficult processes in conventional optical lithography.

The half tone reticle differs from Levenson type which provides a large effect but which needs advancement of peripheral technology such as CAD, and the manufacture of the same is very easy. As regards a film to be formed on a substrate, a single layer of film which is able to control both of amplitude and phase is supplied and, therefore, the patterning can be performed on the basis of conventional techniques.

The present invention relates to an exposure method and an exposure apparatus which use such a half tone reticle.

A problem involved in use of a half tone reticle may be stability of film that provides the half tone characteristic. Conventional reticles provide binary transmission mode of transmission and non-transmission. Non-transmission is assured simply by forming a light blocking film of chromium, for example, to a thickness of a certain value or more. In the case of half tone reticle, on the other hand, it is necessary to accurately control the thickness of a material that attenuates light, so as to provide predetermined transmissivity and phase. Particularly, in the wavelength region of ultraviolet light, since the energy of light is large, there arises a large problem if the transmissivity or phase changes with time, though it is good in the initial stage. Particularly, use of a KrF excimer laser has been considered and, in a large photon energy region such as deep ultraviolet region, care should be taken to the possibility of change in film with lapse of time, due to the light used in the exposure process.

As regards the effect of change in phase and amplitude with lapse of time upon the imaging performance, there are two elements. One is the effect upon the size of pattern to be formed (that is, printing linewidth). The other is the presence of flare light produced as a result of overlapping with an adjacent shot. Of these elements, the first one, that is, the effect on the line width can be controlled on the basis of exposure amount. Since, for final determination of exposure amount, usually trial printing is performed and line width is measured by using SEM, it is possible to correct characteristic change of a half tone film, to some extent. As regards the second element, however, the overlapping with an adjacent shot can not be avoided by using the exposure amount, and thus it is not possible to remove the effect of characteristic change with lapse of time.

The effect of overlapping with an adjacent shot in the case of half tone reticle may be removed by a method wherein a very fine pattern which is so narrow that cannot be resolved is provided in juxtaposition of an actual circuit pattern. Light that impinges on such fine pattern is diffracted and scattered outwardly of an optical system, and they do not reach a wafer. In this specification, such a fine pattern portion will hereinafter be referred to as "light blocking zone". FIG. 2 illustrates an example where such a light blocking zone is applied actually. Disposed in juxtaposition of a circuit pattern 2 which is formed on a half tone reticle 1, is a light blocking zone 3 which is defined by a fine pattern. In this example, it comprises a diced pattern as illustrated. This fine pattern is so set that, when the numerical aperture of a projection optical system is NA and exposure wavelength is $\lambda$, a pitch p satisfies the following relation:

$$p < 0.5 \lambda / NA \tag{1}$$

FIG. 3 illustrates the operation of the fine pattern formed in the light blocking zone. Light impinging on the half tone reticle 1 is diffracted by the zone 3. What is important to avoid the effect of overlapping is:

1) Diffraction angle of diffraction light should be large so as to prevent capturing of diffraction light by the projection optical system 4; and
2) Zero-th order light should be extinguished by the effect of amplitude and phase of the half tone film.

What determines the condition of diffraction angle in item 1) is equation (1). The condition of item 2) is influenced by change in amplitude and phase with lapse of time. Particularly, since extinction of zero-th order light is held upon subtle balance of phase and amplitude of the half tone film, changes in optical characteristic of the film with lapse of time have a large influence on the imaging performance.

FIG. 4 illustrates the phenomenon which occurs when zero-th order light appears. On a wafer which is a subject to be exposed, there are formed circuit patterns in a grid-like array relation with use of step function of a stepper. If zero-th light appears, light in the region of light blocking zone 3 which is juxtaposed to a circuit pattern is not completely blocked. In this case, since it is only zero-th order light that passes the optical system, the fine pattern is not resolved. However, as regards the portion corresponding to the zone 3, it has a certain DC-component-like light intensity upon the wafer. Namely, when the circuit pattern portion 2 is exposed, the light blocking portion 3 on the outside marginal region is also exposed, though the light quantity is small. The light intensity distribution in the light blocking zone 3 then overlaps on the circuit pattern portion of an adjacent shot, in response to procedure of step-and-repeat exposure, and it influences dimension precision of a pattern to be transferred. Particularly, at corner portions, such unwanted light accumulates in triple, and the influence is large.

SUMMARY OF THE INVENTION

It is an object of the present invention to detect light which may be produced in accordance with the stage of a half tone reticle and which may act as a flare component, and to discriminate usability or unusability of the half tone reticle.

Particularly, it is an object of the present invention to provide an exposure method and/or an exposure apparatus using the same, wherein light quantity at a position of a light blocking zone juxtaposed to a circuit pattern is detected and usability or unusability of a half tone reticle is discriminated.

In accordance with an aspect of the present invention, there is provided a projection exposure method wherein a semi-transparent material effective to partially transmit exposure light and also effective to change a phase of the exposure light is used to form a circuit pattern and a light blocking zone adjacent to the circuit pattern, on a transparent substrate to provide a reticle, the light blocking zone being constituted by a pattern not resolved by a projection optical system, and wherein the reticle is illuminated with the exposure light and is projected on a member to be exposed, through the projection optical system, said method comprising the steps of: detecting light quantity of an image of the light blocking zone as formed through the projection optical system; comparing the result of said detection with a predetermined value; and discriminating appropriateness of performing an exposure process with the reticle, on the basis of said comparison.

Said detection may include performing light quantity detection for the image of the light blocking zone at different locations.

Said method may further comprise displaying an alarm on the basis of said discrimination.

In accordance with another aspect of the present invention, there is provided a projection exposure apparatus to be used with a reticle wherein a semi-transparent material effective to partially transmit exposure light and also effective to change a phase of the exposure light is used to form a circuit pattern and a light blocking zone adjacent to the circuit pattern, upon a transparent substrate to provide the reticle, the light blocking zone being constituted by a pattern not resolved by a projection optical system, and wherein the reticle is illuminated with the exposure light and is projected on a member to be exposed, through the projection optical system, said apparatus comprising: a movable stage for carrying thereon the member and being movable; a photodetector fixedly mounted on said movable stage; and control means for causing said movable stage to move said photodetector to a position where an image of the light blocking zone is formed through the projection optical system, to detect light quantity of the image with said photodetector, and for comparing the result of detection with a predetermined value to discriminate appropriateness of performing an exposure process with the reticle.

Said photodetector may comprise a pinhole and a photoelectric element.

The size of the pinhole may be smaller than the size of the image of the light blocking zone.

The size of the pinhole may be variable.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
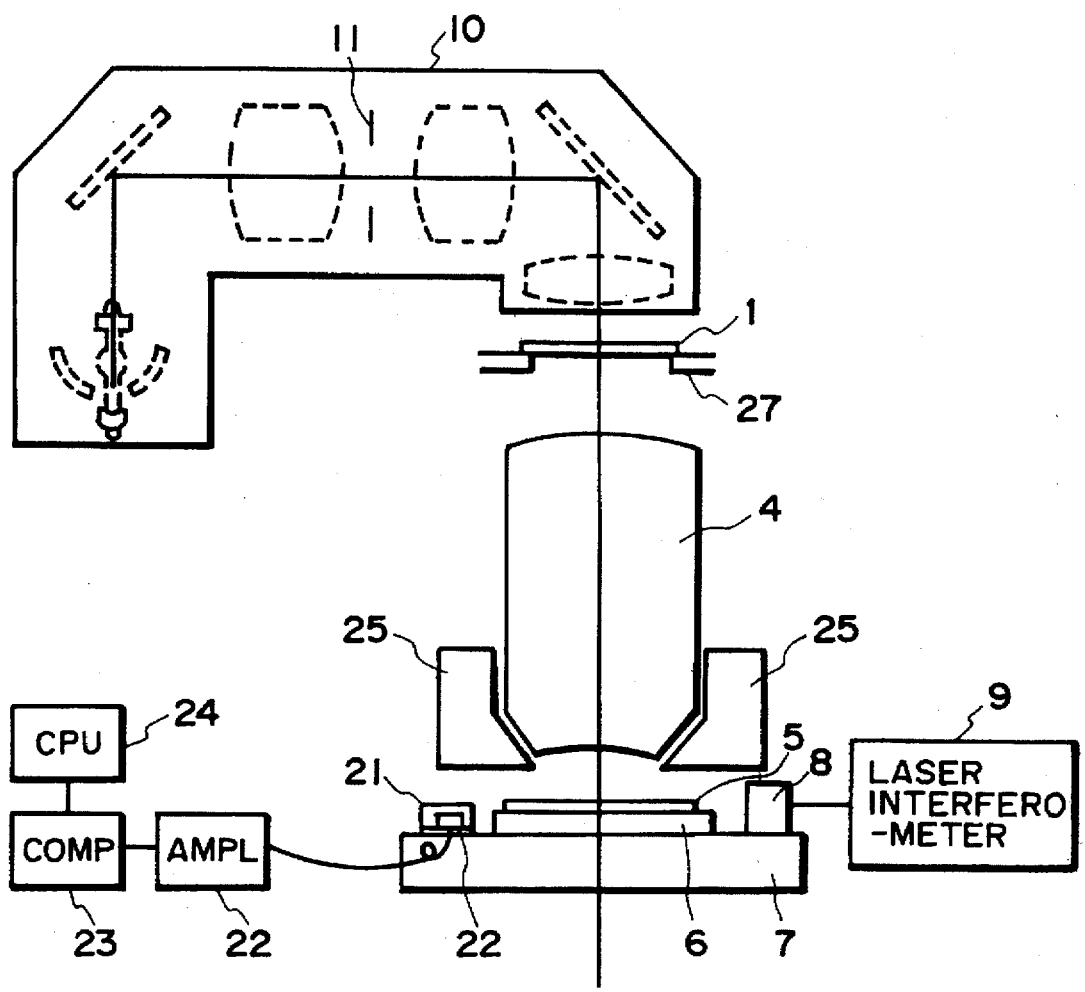
FIG. 1 is a schematic view of an exposure apparatus according to an embodiment of the present invention.
Figure 2:
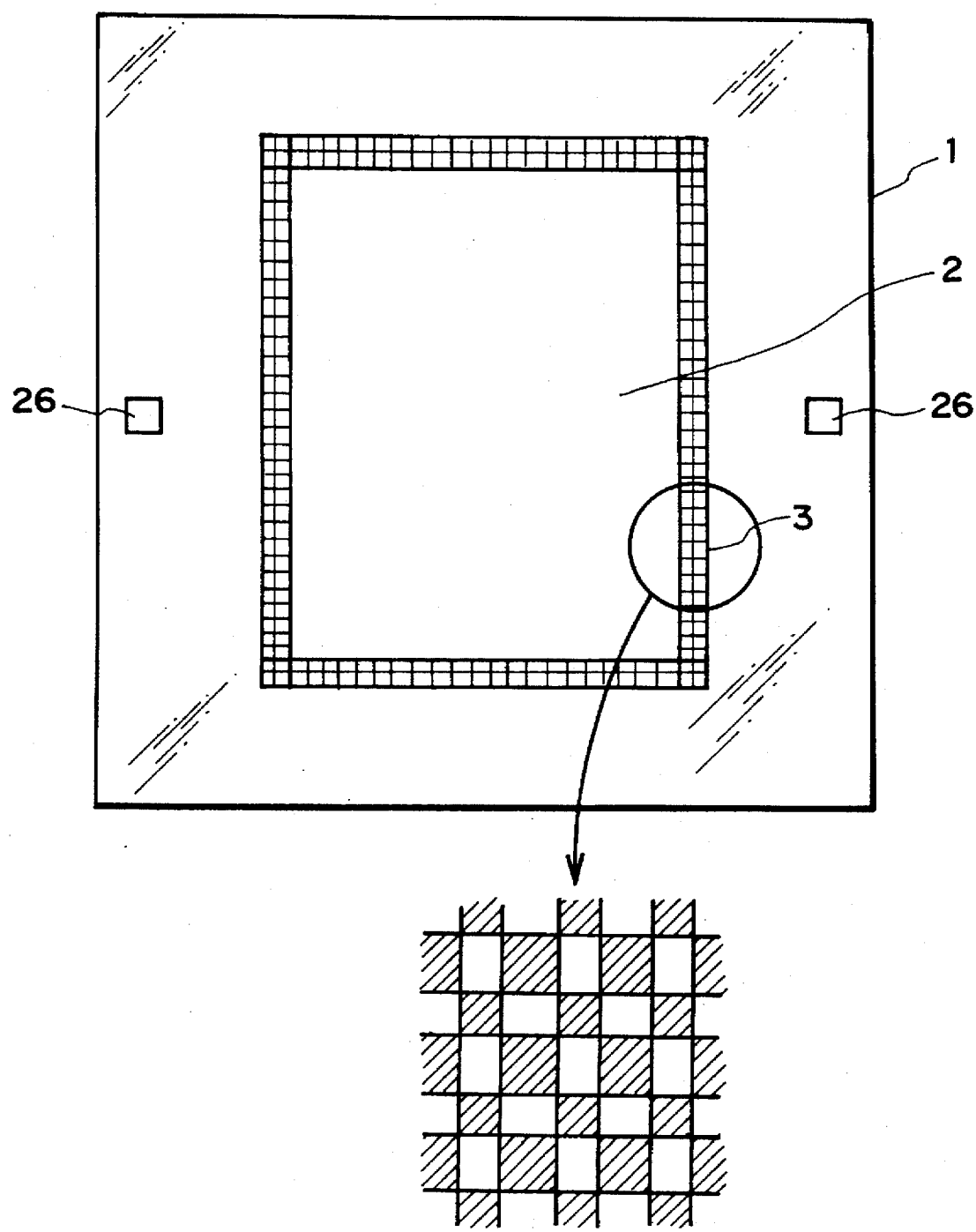
FIG. 2 is an enlarge view for explaining an example of pattern of a half tone reticle.

FIG. 1 is a schematic view of an exposure apparatus according to an embodiment of the present invention. Denoted in the drawing at 10 is an illumination system which includes a masking blade 11 having a masking function for restricting an illumination range. Light from the illumination system 10 illuminates a half tone reticle 1, and a pattern formed on the reticle 1 is imaged on a wafer 5 through a projection optical system 4. The wafer 5 is held by a wafer chuck 6, and the wafer chuck 6 is placed on a wafer stage 7 which performs step-and-repeat operation. The position of the wafer stage 7 is monitored by means of a laser interferometer 9, through a mirror 8 mounted on the wafer stage.

Pinhole 20 is disposed on the wafer stage, and a detector 21 is positioned in correspondence with the pinhole 20. The pinhole 20 and the detector 21 perform a function for monitoring optical characteristic of the half tone reticle in accordance with the present invention. The pinhole 20 and the detector 21 are made as a unit. Since the position of the unit is upon the wafer stage 7, it can be monitored by the laser interferometer 9.

The half tone reticle 1 has formed thereon a circuit pattern 2 and a light blocking zone 3 adjacent thereto and defined by a fine pattern, as described in the introductory part of the specification. In such half tone reticle, a film portion which should block light does not completely block the light as conventional reticles, and a few percentage of light passes therethrough. For this reason, it is necessary to use special measures to block light at a location other than the circuit pattern so as to prevent unwanted additional light from reaching the wafer.

Use of fine pattern in the light blocking zone 3 is an example therefor. The fine pattern may comprise a periodic pattern such as a diced pattern or a grating pattern, for example, for sharply separating diffraction light. In actual exposure process, the masking function provided in the illumination system is used to prevent unwanted portion of the reticle from being illuminated with light. Since the masking function is to intercept light to some extent, it does not have an imaging performance as of the projection optical system. Thus, the light blocking zone 3 is defined by the imaging performance of the masking and, as a result of the masking function, the illumination light is intercepted definitely upon the reticle. Therefore, the light blocking zone is set up to juxtaposition to the circuit pattern. The width of the light blocking plate 3 is determined in accordance with the imaging performance of the masking blade 11 within the illumination system 10 and with driving performance of the blade itself, and it is determined as a value peculiar to the apparatus.

The position of the light blocking zone 3 within the reticle is determined by the design size of the circuit pattern, and it is a predetected parameter to the apparatus. The reticle 1 has reticle alignment marks 26 formed thereon beforehand, for mount to the exposure apparatus. After reticle alignment operation, the reticle 1 is aligned at a high precision not greater than 1 micron, to a value as recognized in the exposure apparatus. Thus, the position on the wafer whereat the light blocking zone 3 on the reticle 1 is imaged is detectable, within the apparatus, at a high precision not greater than 1 micron.

On the other hand, the pinhole 20 and the photodetector 21 for detecting light passing the pinhole 20, are disposed on the wafer stage. Moving the pinhole 20 which serves as a window for detecting light, to the position corresponding to the light blocking zone 3 on the reticle 1, can be easily executed once the position of the pinhole 20 is detected within the apparatus. Also, the position of the pinhole 20 with respect to the direction of an optical axis of the projection optical system 4 can be detected by means of a focusing system 25 which serves to detect the focus position of the projection optical system 4.

Next, the procedure of photoelectric detection using the photodetector 21 will be explained. The half tone reticle 1, after it is conveyed onto a reticle stage 27 by means of a reticle conveying system (not shown), is placed within the exposure apparatus on the basis of the alignment marks 26 formed on the reticle. During this operation, in accordance with the size information about the circuit pattern formed on the reticle, the masking blade 11 in the illumination system 10 is moved to a corresponding position such that the circuit pattern portion can be illuminated with uniform intensity and also that unwanted portion of the reticle is not illuminated. Initial setting is thus completed. The masking function is provided by mounting a blade within the illumination system and by imaging the blade upon the reticle to restrict the illumination range. Since it is not for transferring a circuit pattern, the imaging performance of the blade may not be so good. A blur of a few millimeters upon the reticle is acceptable. For illumination of the reticle, as a result, the circuit pattern area is irradiated with uniform light and, outside the circuit pattern, there is a transition area in which the intensity gradually decreases through a few millimeters in accordance with the blur of the masking blade, the illumination light intensity being zero at the outside thereof.

Depending on the structure of the exposure apparatus, there are cases wherein the masking blade is disposed just adjacent to the reticle and there is no imaging optical system between it and the reticle 1. In such occasions, the amount of blur of the blade 11 on the reticle surface is large and the width of the transition area is also large. Thus, the width of the light blocking zone 3 should be made large, correspondingly.

Figure 3:
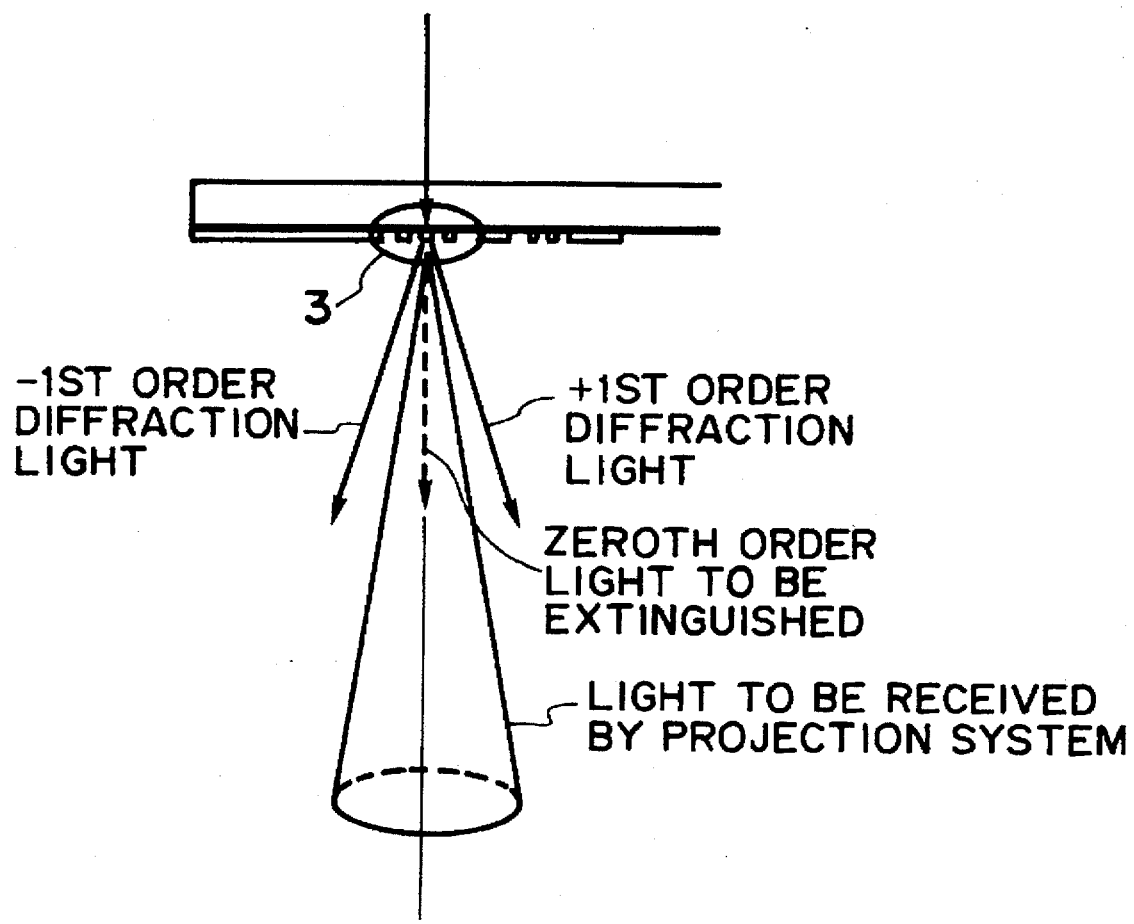
FIG. 3 is a schematic view for explaining the effect of a fine pattern of a light blocking zone.
Figure 4:
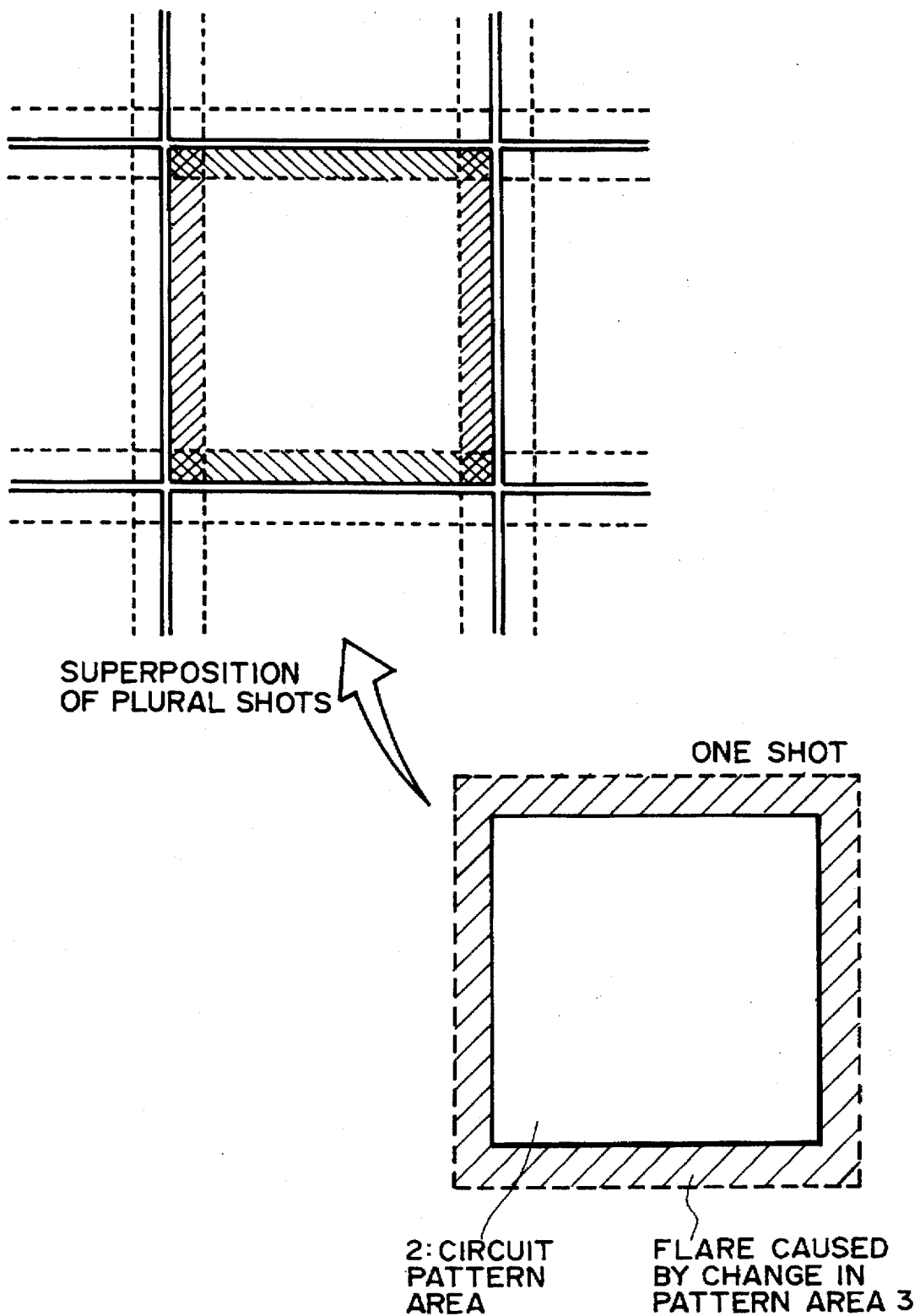
FIG. 4 is a schematic view for explaining the overlap effect of unwanted light resulting from zero-th order light.

In conventional reticles, there is a thick chromium film in such transition area as described above and it provide sufficient light interception. When a half tone reticle is used as it is, light passes there and overlapping phenomenon as illustrated in FIG. 4 results unfavorably. The light blocking zone 3 is provided to this transition area. More specifically, light impinging on the zone 3 is diffracted by a fine periodic pattern, such that a function for intercepting those light rays passing the zone 3 and directed to the wafer as shown in FIG. 3 is provided equivalently. As described in the introductory part of the specification, it is important that, for light interception, the value of zero-th order light which passes straight should be kept zero in respect to phase and amplitude of the half tone film.

Figures 5A, 5B:
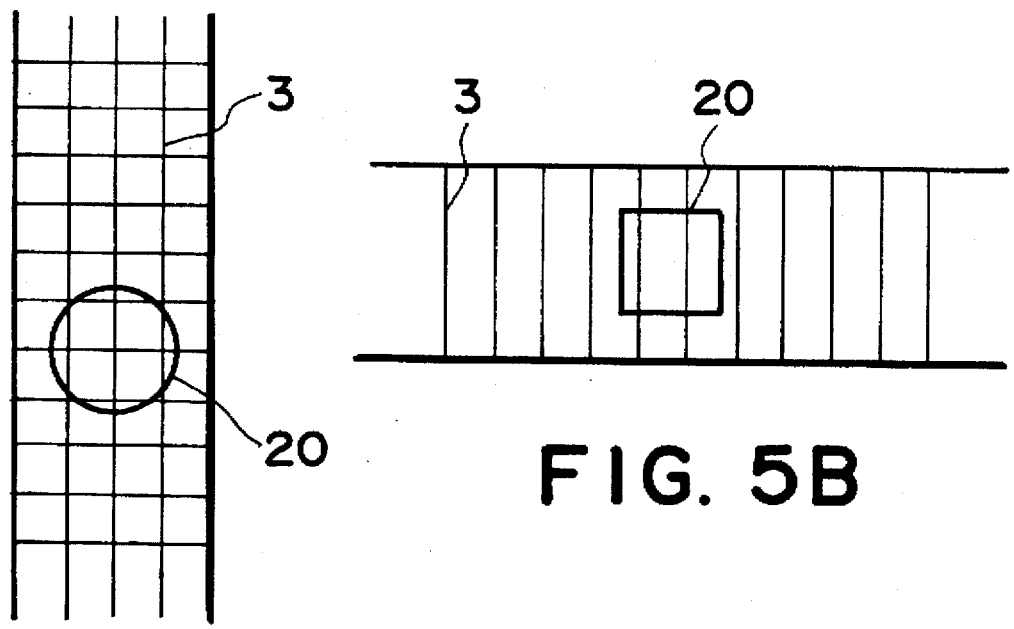
FIGS. 5A and 5B are schematic views for explaining a light blocking zone and a pinhole.

After the reticle is conveyed onto the reticle stage and the reticle alignment operation is completed, the wafer stage 7 is moved so that the pinhole 20 is placed, as shown in FIG. 5, at the position where the light blocking zone 3 is imaged. The position of the pinhole 20 is so set that it is placed within the region where the image of the light blocking zone 3 is formed. The photoelectric detection unit including the pinhole 20 may be used for another purpose, e.g., for measurement of illuminance non-uniformness. If placing the pinhole 20 within the region of the zone 3 is structurally contradictive to the measurement of the illuminance non-uniformness, there may be provided a mechanism for changing the size of the pinhole 20. An example of such occasion may be that the size of the pinhole 20 is too small and it takes too long time for the measurement of illuminance non-uniformness. In this occasion, the diameter of pinhole may be enlarged for the measurement of illuminance non-uniformness, whereas it may be reduced to a value which is predetermined for the light intensity measurement for the light blocking zone 3. It is to be noted that, for measurement of the light quantity in the region corresponding to the light blocking zone 3 by use of the pinhole 20, the position of the pinhole 20 with respect to the optical axis direction is adjusted to be coinciding with the focal plane of the projection optical system by means of the focusing system 25.

With the status described above is accomplished, light quantity measurement is performed by using the photodetector 21. In this state, the detector 21 directly measures the light which unwantedly impinges on a portion other than the circuit pattern. Thus, it directly monitors the state of phase and amplitude of the half tone reticle. The detected value is applied to a comparator 23 and to a CPU 24. If the output of the photodetector 21 exceeds a predetermined level, it can be discriminated that "the optical performance of the half tone reticle is insufficient and the light blocking zone does not function well as expected, such that the reticle is unusable". The wafer stage 7 may be moved along the region of the zone 3 and discrimination may be made at different locations. This is effective to detect a difference with location. In that occasion, the optical performance of the half tone reticle may be discriminated as being insufficient, if the predetermined level is exceeded at any of different location. The CPU 24 then concludes interruption of the exposure process with that reticle. Subsequently, the reticle is unloaded from the reticle stage, and an alarm is displayed at a CRT (not shown).

When measurement is to be done by use of the photodetector 21, a shutter of the illumination system is opened. Thus, the measurement is made by using the light from the illumination system to be used for the exposure process (i.e., exposure wavelength), and also the measurement is performed in the actual exposure condition. Thus, the imaging state is directly monitored. Therefore, the reliability is high, and it is practical.

Further, in the present invention, the exposure apparatus itself is used to perform the measurement and the number of measurement points is small. Thus, the measurement can be made quickly. Also, there is no need of using a separate (off-line) measuring apparatus for measuring the optical performance of the half tone reticle. If such off-line measuring apparatus is used, it is necessary to measure both of amplitude and phase at high precision. In the present invention, on the other hand, the measurement is performed while both are mixed. Actually, zero-th order light is produced when either phase or amplitude changes. Therefore, for discrimination of usability and non-usability, the method of the present invention by which measurement is performed while both are mixed is better.

A second embodiment of the present invention is that the measurement in the zone 3 is performed while keeping the masking blade open. This assures the measurement without affected by the imaging performance of the masking function. If transitional light distributions of the masking imaging function are accumulated at the light blocking zone 3 area, the measurement may be influenced by a difference in the setting of masking blade or in the imaging performance of the illumination system. It results in such occasion that the same sensitivity is not provided at the four sides around the circuit pattern. In an extreme case, it is possible that if the adjustment of masking blade orthogonality is different, the light distribution is different between opposite ends of the same side. While the example of performing measurement at different locations as described in reference to the first embodiment has a function for removing such influence, it is not necessary to take the effect of masking into consideration provided that the half tone reticle itself has a predetermined performance. Therefore, in order to purely extract the performance of the half tone reticle itself, light of uniform distribution like that to the circuit pattern area may be applied to the light blocking zone 3. If this is done, the light blocking zone 3 is irradiated with more intense light, and the measurement is performed under strict condition. This enable exact measurement.

Therefore, the same strength of light as of the light to the circuit pattern may be applied to the zone 3 while keeping that the masking blade does not overlap the light blocking zone 3. By detecting the output of the photodetector 21 in that state, reliable measurement is accomplished. As a matter of course, in that case, measurement may be made at different locations for measurement of any dispersion in the plane of the half tone reticle 1 film, for higher reliability.

While the foregoing description has been made with reference to examples wherein a particular note is paid to changes of a half tone reticle with lapse of time, which reticle has good initial performance, the method of the present invention may be applied to initial performance check of a half tone reticle, including discrimination of goodness/non-goodness of patterning of the light blocking zone.

Further, the foregoing description has been made with reference to examples wherein light quantity distribution of the light blocking zone 3 is measured by using a photoelectric detection system having a pinhole, since what is important in the present invention is to measure light quantity distribution related to the light blocking zone and to make discrimination, a light quantity distribution measuring device such as a CCD, for example, may of course be used and disposed at the imaging position in place of the pinhole optical system.

While the invention has been described with reference to the structures disclosed herein, it is not confined to the details set forth and this application is intended to cover such modifications or changes as may come within the purposes of the improvements or the scope of the following claims.

What is claimed is:

1. A projection exposure method wherein a semi-transparent material effective to partially transmit exposure light and also effective to change a phase of the exposure light is used to form a circuit pattern and a light blocking zone adjacent to the circuit pattern, on a transparent substrate to provide a reticle, the light blocking zone being constituted by a pattern not resolved by a projection optical system, and wherein the reticle is illuminated with the exposure light and is projected on a member to be exposed, through the projection optical system, said method comprising the steps of:

detecting light quantity of an image of the light blocking zone as formed through the projection optical system;

comparing the result of said detection with a predetermined value; and discriminating appropriateness of performing an exposure process with the reticle, on the basis of said comparison.

2. A method according to claim 1, wherein said detection includes performing light quantity detection for the image of the light blocking zone at different locations.

3. A method according to claim 1, further comprising displaying an alarm on the basis of said discrimination.

4. A projection exposure apparatus to be used with a reticle wherein a semi-transparent material effective to partially transmit exposure light and also effective to change a phase of the exposure light is used to form a circuit pattern and a light blocking zone adjacent to the circuit pattern, upon a transparent substrate to provide the reticle, the light blocking zone being constituted by a pattern not resolved by a projection optical system, and wherein the reticle is illuminated with the exposure light and is projected on a member to be exposed, through the projection optical system, said apparatus comprising:

a movable stage for carrying thereon the member and being movable;

a photodetector fixedly mounted on said movable stage; and control means for causing said movable stage to move said photodetector to a position where an image of the light blocking zone is formed through the projection optical system, to detect light quantity of the image with said photodetector, and for comparing the result of detection with a predetermined value to discriminate appropriateness of performing an exposure process with the reticle.

5. An apparatus according to claim 4, wherein said photodetector comprises a pinhole and a photoelectric element.

6. An apparatus according to claim 5, wherein the size of the pinhole is smaller than the size of the image of the light blocking zone.

7. An apparatus according to claim 5, wherein the size of the pinhole is variable.

* * * * *

UNITED STATES PATENT AND TRADEMARK OFFICE
CERTIFICATE OF CORRECTION

PATENT NO. : 5,686,984
DATED : November 11, 1997
INVENTOR(S) : AKIYOSHI SUZUKI

It is certified that error appears in the above-identified patent and that said Letters Patent is hereby corrected as shown below:

COLUMN 1:

Line 28, "provides" should read --provide--.

COLUMN 4:

Line 16, "enlarge" should read --enlarged--.

COLUMN 5:

Line 67, "transition" should read --a transition-- and "provide" should read --provides--.

Signed and Sealed this

Twelfth Day of May, 1998

Attest:

BRUCE LEHMAN

*Attesting Officer*    *Commissioner of Patents and Trademarks*